United States Patent
Chin et al.

(10) Patent No.: US 9,977,521 B2
(45) Date of Patent: May 22, 2018

(54) METHOD FOR CONTROLLING AN ELECTRONIC DEVICE EQUIPPED WITH SENSING COMPONENTS, AND ASSOCIATED APPARATUS

(71) Applicant: HTC Corporation, Taoyuan County (TW)

(72) Inventors: Ssu-Po Chin, Taoyuan (TW); Abhishek Saxena, Taoyuan (TW); Sheng-Yang Pan, Taoyuan (TW)

(73) Assignee: HTC Corporation, Taoyuan (TW)

( * ) Notice: Subject to any disclaimer, the term of this patent is extended or adjusted under 35 U.S.C. 154(b) by 529 days.

(21) Appl. No.: 14/599,993

(22) Filed: Jan. 19, 2015

(65) Prior Publication Data

US 2015/0268378 A1 Sep. 24, 2015

Related U.S. Application Data

(60) Provisional application No. 61/969,275, filed on Mar. 24, 2014.

(51) Int. Cl.
*G01V 99/00* (2009.01)
*G01R 33/07* (2006.01)
(Continued)

(52) U.S. Cl.
CPC .............. *G06F 3/041* (2013.01); *G01R 33/07* (2013.01); *G01R 33/072* (2013.01); *G06F 3/038* (2013.01); *G06F 3/0416* (2013.01); *G06F 3/0488* (2013.01)

(58) Field of Classification Search
CPC ....... G01R 33/07; G01R 33/072; G06F 3/038; G06F 3/041; G06F 3/0416; G06F 3/0488;
(Continued)

(56) References Cited

U.S. PATENT DOCUMENTS 9,411,048 B2 * 8/2016 Vieta ................. H04M 1/72519
2010/0159998 A1 6/2010 Luke
(Continued)

FOREIGN PATENT DOCUMENTS

CN 102665008 A 9/2012
TW 201014175 A1 4/2010
(Continued)

OTHER PUBLICATIONS

Office action dated Mar 7, 2017 for the Taiwan application No. 104107636, filed Mar 10, 2015, p. 1-4.
(Continued)

*Primary Examiner* — John H Le
(74) *Attorney, Agent, or Firm* — Winston Hsu

(57) ABSTRACT

A method for controlling an electronic device and an associated apparatus are provided, where the electronic device includes a proximity sensor for performing proximity detection, and the method includes the steps of: determining whether a first condition is satisfied according to an application status; performing a proximity sensor threshold adjustment operation corresponding to the first condition when the first condition is satisfied, to obtain an adjusted proximity sensor threshold for the proximity sensor; and performing proximity detection by utilizing the proximity sensor according to the adjusted proximity sensor threshold. The step of determining whether the first condition is satisfied according to the application status may further include: when a specific application is running in the foreground or launched, determining that the first condition is satisfied. For example, when the specific application is running in the foreground, the proximity sensor threshold adjustment operation corresponding to the specific application can be performed.

16 Claims, 8 Drawing Sheets

(51) Int. Cl.
*G06F 3/041* (2006.01)
*G01P 15/00* (2006.01)
*G06F 3/0488* (2013.01)
*G06F 3/038* (2013.01)

(58) Field of Classification Search
CPC .... G06F 1/3231; G06F 1/3265; G01S 17/026; G01S 7/4802
USPC .................. 702/150; 345/173, 175; 356/4.01; 455/566, 567
See application file for complete search history.

(56) References Cited

U.S. PATENT DOCUMENTS

2012/0139877 A1* 6/2012 Kawabe ................ G06F 1/1643
345/175
2013/0208257 A1 8/2013 Dyer
2014/0302893 A1* 10/2014 Dhavaloganathan
.......................... H04M 1/72577
455/566
2014/0354567 A1* 12/2014 Park ....................... G06F 3/0488
345/173

FOREIGN PATENT DOCUMENTS

| TW | 201318364 A1 | 5/2013 |
| TW | 201319866 A1 | 5/2013 |

OTHER PUBLICATIONS

Office action dated Jun. 28, 2017 for the China application No. 201510115361.5, filing date Mar. 17, 2015, p. 1-9.

* cited by examiner (a)

(b)

METHOD FOR CONTROLLING AN ELECTRONIC DEVICE EQUIPPED WITH SENSING COMPONENTS, AND ASSOCIATED APPARATUS

CROSS REFERENCE TO RELATED APPLICATIONS

This application claims the benefit of U.S. Provisional Application No. 61/969,275, which was filed on Mar. 24, 2014, and is included herein by reference.

BACKGROUND OF THE INVENTION

1. Field of the Invention

The present invention relates to functionality control of portable electronic devices having sensing components such as proximity sensors (P-sensors), light sensors (L-sensors), and motion sensors, and more particularly, to method for controlling an electronic device equipped with sensing components, and associated apparatus 2. Description of the Prior Art According to the related art, after a conventional portable electronic device such as a conventional mobile phone is used for a period of time, the conventional proximity detection of conventional portable electronic may be inaccurate since the conventional P-sensor therein may be impacted or influenced by some reasons. More particularly, there may be a gap between the conventional P-sensor and the glass that covers the conventional P-sensor in some unwanted situations, and the gap may degrade the accuracy of the conventional proximity detection. For example, the gap may be caused by the factory assembling bias. In another example, the gap may be caused by device dropping (e.g. the conventional portable electronic device is unintentionally dropped). In addition, sometimes there may be something dirty such as the dirt on the glass that covers the conventional P-sensor, and the dirt may degrade the accuracy of the conventional proximity detection. As a result, the conventional proximity detection may tend to report "NEAR" (which typically means something is close to the conventional P-sensor), bringing inconvenience of the user of the conventional portable electronic device.

In conclusion, the gap and the dirt may cause inaccuracy of the conventional P-sensor and may cause inaccuracy of the conventional proximity detection, and therefore the performance of the conventional portable electronic device may become unacceptable. Therefore, a novel method and a novel architecture is required for improving the performance of electronic devices.

SUMMARY OF THE INVENTION

It is an objective of the claimed invention to provide a method for controlling an electronic device, and an associated apparatus, in order to solve the above-mentioned problems.

It is an objective of the claimed invention to provide a method for controlling an electronic device, and an associated apparatus, in order to enhance the performance of an electronic device.

According to at least one preferred embodiment, a method for controlling an electronic device is provided, where the electronic device comprises a proximity sensor (P-sensor) for performing proximity detection, and the method comprises the steps of: determining whether a first condition is satisfied according to an application status; performing a proximity sensor threshold adjustment operation corresponding to the first condition when the first condition is satisfied, to obtain an adjusted proximity sensor threshold for the proximity sensor; and performing proximity detection by utilizing the proximity sensor according to the adjusted proximity sensor threshold. More particularly, the step of determining whether the first condition is satisfied according to the application status may further comprise: when a specific application is running in the foreground or launched, determining that the first condition is satisfied. For example, when the specific application is running in the foreground, the proximity sensor threshold adjustment operation corresponding to the specific application is performed.

According to at least one preferred embodiment, an apparatus for controlling an electronic device is provided, where the apparatus comprises at least one portion of the electronic device. The apparatus comprises a proximity sensor (P-sensor), and further comprises a control circuit that is coupled to the proximity sensor. In addition, the proximity sensor is arranged for performing proximity detection, and the control circuit is arranged for controlling operations of the electronic device. Additionally, the control circuit determines whether a first condition is satisfied according to an application status, performs a proximity sensor threshold adjustment operation corresponding to the first condition when the first condition is satisfied, to obtain an adjusted proximity sensor threshold for the proximity sensor, and performs proximity detection by utilizing the proximity sensor according to the adjusted proximity sensor threshold. More particularly, the control circuit comprises a processor arranged for running program codes (e.g. applications, and/or other types of software modules) to control operations of the electronic device, and when a specific application is running in the foreground or launched, the processor determines that the first condition is satisfied. For example, when the specific application is running in the foreground, the proximity sensor threshold adjustment operation corresponding to the specific application is performed.

It is an advantage of the present invention that the present invention method and apparatus can guarantee the performance of the electronic device by performing the proximity sensor threshold adjustment operation corresponding to the first condition, such as the proximity sensor threshold adjustment operation corresponding to the specific application. In addition, the present invention method and apparatus can perform automatic calibration (or auto-calibration) of the P-sensor, where a proximity sensor threshold of the P-sensor, such as a dynamic P-sensor threshold, can be calculated dynamically. As the electronic device implemented according to the present invention method and apparatus uses the proximity sensor threshold such as the dynamic P-sensor threshold, rather than a fixed threshold that is typically used in the related art, the present invention method and apparatus can enhance, and guarantee, the overall performance of an electronic device such as a mobile phone.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
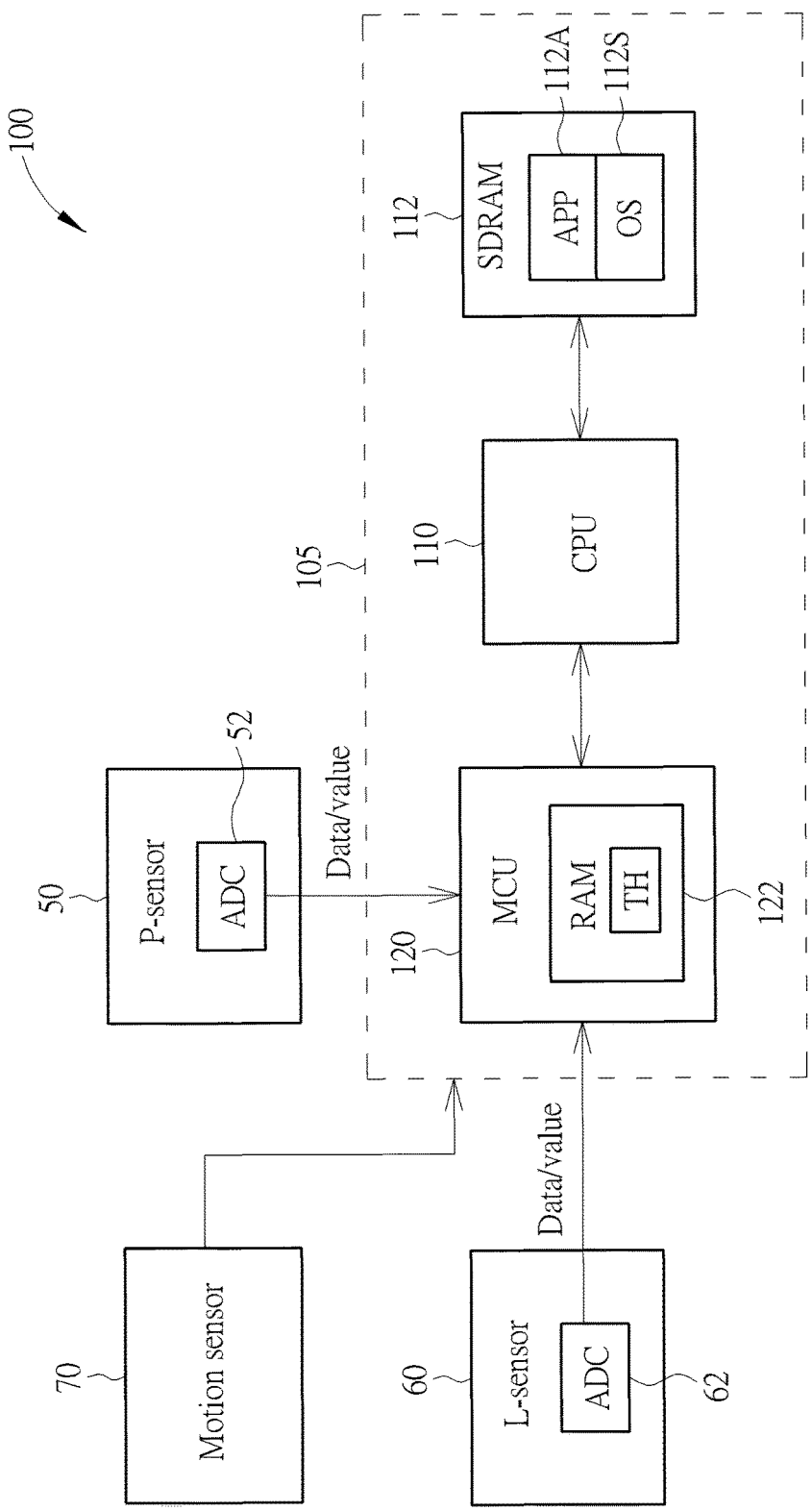
FIG. 1 is a diagram of an apparatus for controlling an electronic device according to an example.

FIG. 1 is a diagram of an apparatus 100 for controlling an electronic device according to an example, where the apparatus 100 may comprise at least one portion (e.g. a portion or all) of an electronic device. For example, the apparatus 100 may comprise a portion of the electronic device, such as some hardware circuits and some modules within the electronic device. In another example, the apparatus 100 can be the whole of the electronic device. Examples of the electronic device mentioned above may include, but not limited to, a mobile phone (e.g. a multifunctional mobile phone), a tablet, and a personal computer (PC).

As shown in FIG. 1, the apparatus 100 may comprise a plurality of sensing components, where the plurality of sensing components may comprise a proximity sensor (P-sensor) 50, a light sensor (L-sensor) 60, and may further comprise at least one motion sensor (e.g. one or more motion sensors), which can be collectively referred to as the motion sensor 70. Examples of the aforementioned at least one motion sensor may include, but not limited to, an accelerometer, a G-sensor, a Gyro sensor, and an electronic compass (E-compass). More particularly, the P-sensor 50 may comprise an analog-to-digital converter (ADC) 52, and the L-sensor 60 may comprise an ADC 62. In addition, the apparatus 100 may further comprises at least one control circuit (e.g. one or more control circuits), which can be collectively referred to as the control circuit 105, where the aforementioned at least one control circuit (e.g. the control circuit 105 shown in FIG. 1) may comprise a processor such as a central processing unit (CPU) 110, a Synchronous Dynamic Random Access Memory (SDRAM) 112, and a controller such as a micro control unit (MCU) 120. The processor mentioned above, such as the CPU 110, is arranged for running program codes (e.g. applications, and/ or other types of software modules) to control operations of the electronic device. Additionally, the MCU 120 may comprise a Random Access Memory (RAM) 122.

According to this example, the apparatus 100 is capable of utilizing the aforementioned at least one control circuit (more particularly, the processor therein, such as the CPU 110, and/or the controller therein, such as the MCU 120) to control operations of the electronic device, and is capable of utilizing the plurality of sensing components such as the P-sensor 50, the L-sensor 60, and the motion sensor 70 to perform associated sensing operations. For example, in a sleep mode of the electronic device, the MCU 120 may control operations of the electronic device, and the CPU 110 may be inactive, where the MCU 120 may utilize at least one portion (e.g. a portion or all) of the plurality of sensing components, such as at least one portion (e.g. a portion or all) of the P-sensor 50, the L-sensor 60, and the motion sensor 70, to perform at least one portion (e.g. a portion or all) of the associated sensing operations. In addition, in an active mode (e.g. a non-sleep mode) of the electronic device, the CPU 110 may be active, and both of the CPU 110 and the MCU 120 may control operations of the electronic device, where the CPU 110 may utilize at least one portion (e.g. a portion or all) of the plurality of sensing components, such as at least one portion (e.g. a portion or all) of the P-sensor 50, the L-sensor 60, and the motion sensor 70, to perform at least one portion (e.g. a portion or all) of the associated sensing operations, while the MCU 120 may utilize at least one portion (e.g. a portion or all) of the plurality of sensing components, such as at least one portion (e.g. a portion or all) of the P-sensor 50, the L-sensor 60, and the motion sensor 70, to perform at least one portion (e.g. a portion or all) of the associated sensing operations. This is for illustrative purposes only, and is not meant to be a limitation of the present invention. In some examples, in the aforementioned active mode (e.g. the non-sleep mode mentioned above) of the electronic device, the CPU 110 may be active, and both of the CPU 110 and the MCU 120 may control operations of the electronic device, where the MCU 120 may utilize at least one portion (e.g. a portion or all) of the plurality of sensing components, such as at least one portion (e.g. a portion or all) of the P-sensor 50, the L-sensor 60, and the motion sensor 70, to perform at least one portion (e.g. a portion or all) of the associated sensing operations, and the CPU 110 may obtain at least one portion (e.g. a portion or all) of sensing results of the associated sensing operations from the MCU 120.

In this example, the apparatus 100 is capable of performing P-sensor auto-calibration. The MCU 120 may utilize the P-sensor 50 to perform proximity detection based on a proximity sensor threshold TH stored in the RAM 122. For example, when the data from the ADC 52 of the P-sensor 50, such as an ADC value of the P-sensor 50, reaches (more particularly, is greater than or equal to) the proximity sensor threshold TH, the MCU 120 determines the proximity detection result of the P-sensor 50 to be NEAR, which means something outside the electronic device is close to the P-sensor 50. In another example, when the data from the ADC 52 of the P-sensor 50, such as an ADC value of the P-sensor 50, does not reach (more particularly, is less than) the proximity sensor threshold TH, the MCU 120 determines the proximity detection result of the P-sensor 50 to be FAR, which means nothing outside the electronic device is close to the P-sensor 50. In addition, the MCU 120 may utilize the L-sensor 60 to perform ambient light detection. More particularly, when the data from the ADC 62 of the L-sensor 60, such as an ADC value of the L-sensor 60, is sent to the MCU 120, the MCU 120 determines the ambient light detection result of the L-sensor 60 to be an ambient light level L_amb corresponding to the ADC value of the L-sensor 60. For example, in response to the ADC value of the L-sensor 60, the ambient light level L_amb may vary, and more particularly, may be an integer value that falls within the range of the interval [0, 10]. In this example, in a situation where the electronic device is put under the sun, the ambient light detection result of the L-sensor 60 may approach or reach a maximum value within the range of the interval [0, 10] (e.g. L_amb=10, which may indicate that the electronic device is put under strong light). In addition, in a situation where the electronic device is put in a dark room, the ambient light detection result of the L-sensor 60 may approach or reach a minimum value within the range of the interval [0, 10] (e.g. L_amb=0, which may indicate that the electronic device is put in the dark).

Please note that the MCU 120 may send an interrupt (more particularly, a hardware interrupt signal) to the CPU 110 to notify the CPU 110 of the occurrence of NEAR/FAR switching regarding the proximity detection result of the P-sensor 50, and the CPU 110 may read data from the RAM 122, for performing P-sensor auto-calibration. For example, during P-sensor auto-calibration, the MCU 120 may dynamically change the proximity sensor threshold TH based on various kinds of conditions, where the conditions may be associated with an application 112A that is read from the SDRAM 112 and is running on the CPU 110, an operating system (OS) 112S that is read from the SDRAM 112 and is running on the CPU 110, the latest data of the proximity detection result of the P-sensor 50, historical data of the proximity detection result of the P-sensor 50, the latest data of the ambient light detection result of the L-sensor 60, and/or historical data of the ambient light detection results of the L-sensor 60.

Figure 2:
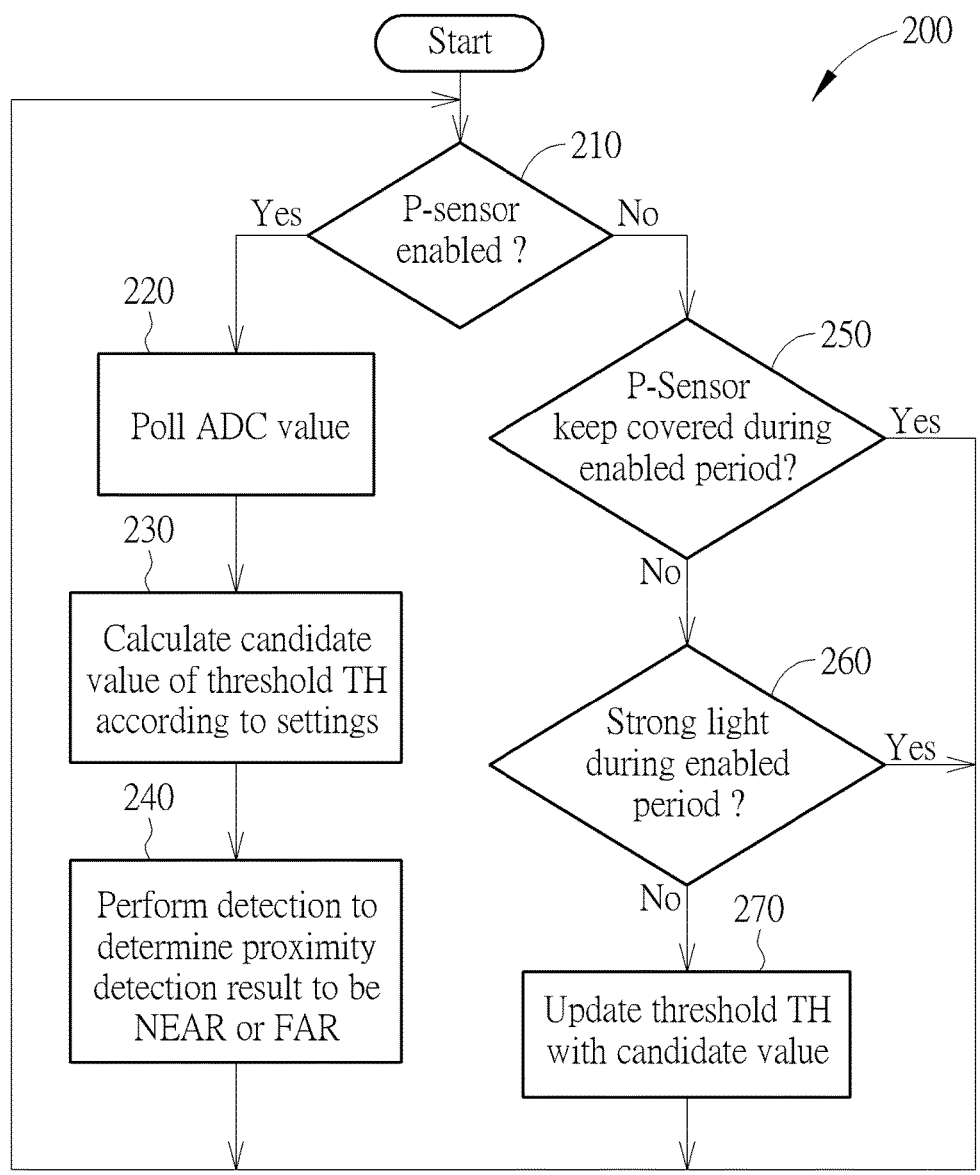
FIG. 2 illustrates a flowchart of a method for performing proximity sensor (P-sensor) auto-calibration according to an example.

FIG. 2 illustrates a flowchart of a method 200 for performing P-sensor auto-calibration according to an example, where the method 200 can be applied to the apparatus 100 shown in FIG. 1.

In Step 210, the MCU 120 checks whether the P-sensor 50 is enabled. When it is detected that the P-sensor 50 is enabled, Step 220 is entered; otherwise, Step 250 is entered.

In Step 220, the MCU 120 polls (e.g. periodically reads) the ADC value of the P-sensor 50. As the MCU 120 may continue polling the ADC value of the P-sensor 50 in the leftmost loop comprising Step 210, Step 220, Step 230, and Step 240 in a pre-decided (or a predetermined) time frame to collect a set of collected data of the ADC value of the P-sensor 50 while the P-sensor 50 is enabled, the MCU 120 may calculate the proximity sensor threshold TH dynamically.

In Step 230, the MCU 120 calculates a candidate value of the proximity sensor threshold TH according to some settings (e.g. default settings and/or user settings), where the proximity sensor threshold TH can be referred to as "threshold TH" in the example shown in FIG. 2, for brevity. For example, based on the default settings, the MCU 120 may compare a value within the set of collected data of the ADC value of the P-sensor 50 with another value within the set of collected data of the ADC value of the P-sensor 50, to determine a minimum of the set of collected data that is just obtained in Step 220, and utilize this minimum as the candidate value of the proximity sensor threshold TH. Thus, the MCU 120 may calculate the "New Threshold" (more particularly, the candidate value of the proximity sensor threshold TH) in run time. This is for illustrative purposes only, and is not meant to be a limitation of the present invention. In another example, based on the user settings such as the settings varied from the default settings by the user of the electronic device, the MCU 120 may apply a predetermined filtering operation to the set of collected data of the ADC value of the P-sensor 50, in order to remove invalid data such as that due to noise from this set of collected data.

In Step 240, the MCU 120 performs detection (more particularly, utilizes the P-sensor 50 to perform the aforementioned proximity detection) to determine the proximity detection result to be NEAR or FAR. For example, the MCU 120 utilizes the P-sensor 50 to perform the aforementioned proximity detection, and therefore determines the proximity detection result to be NEAR. In another example, the MCU 120 utilizes the P-sensor 50 to perform the aforementioned proximity detection, and therefore determines the proximity detection result to be FAR.

In Step 250, the MCU 120 checks whether the P-Sensor 50 is covered during the enabled period (e.g. the period that the apparatus 100 just stayed in the leftmost loop of the working flow shown in FIG. 2). For example, the RAM 122 may store the historical data of the proximity detection result of the P-sensor 50, and the MCU 120 may calculate an average of the historical data of the proximity detection result of the P-sensor 50. When the candidate value of the proximity sensor threshold TH (more particularly, the latest candidate value that is just obtained from Step 230 in the leftmost loop mentioned above) is much greater than this average of the historical data of the proximity detection result of the P-sensor 50, the MCU 120 determines that the P-Sensor 50 is covered during this enabled period.

In practice, in a situation where the latest candidate value is greater than this average, the MCU 120 may calculate a difference between the latest candidate value and this average, and determine whether the difference reaches (more particularly, is greater than or equal to) a predetermined covered-P-sensor threshold. When the difference reaches (more particularly, is greater than or equal to) the predetermined covered-P-sensor threshold, the MCU 120 determines that the P-Sensor 50 is covered during this enabled period, and therefore Step 210 is re-entered; otherwise, the MCU 120 determines that the P-Sensor 50 is not covered during this enabled period, and therefore Step 260 is entered.

In Step 260, the MCU 120 checks whether there is strong light during the same enabled period mentioned in Step 250 (e.g. the period that the apparatus 100 just stayed in the leftmost loop of the working flow shown in FIG. 2). For example, the RAM 122 may store the historical data of the ambient light detection result of the L-sensor 60, and the historical data of the ambient light detection result may comprise a set of ambient light historical data obtained (or detected) during this period, such as a set of collected ambient light levels {L_amb} (each of which may be an integer value that falls within the range of the interval [0, 10], for example). Thus, the set of ambient light historical data can be referred to as the set of ambient light historical data {L_amb} in this example. Please note that the MCU 120 may analyze this set of ambient light historical data {L_amb} corresponding to this period to determine whether there is strong light during this enabled period.

In practice, the MCU 120 may compare this set of ambient light historical data {L_amb} (more particularly, the set of collected ambient light levels {L_amb}, each of which may be an integer value that falls within the range of the interval [0, 10], for example) with a predetermined strong light threshold (e.g. a fixed value that falls within the range of the interval [0, 10], such as a predetermined value 7, for example), respectively, to determine whether there is strong light during this enabled period. When any of this set of ambient light historical data {L_amb} reaches (more particularly, is greater than or equal to) the predetermined strong light threshold, the MCU 120 determines that there is strong light during this enabled period, and therefore Step 210 is re-entered; otherwise, the MCU 120 determines that there is no strong light during this enabled period, and therefore Step 270 is entered.

In Step 270, the MCU 120 updates the proximity sensor threshold TH with the candidate value mentioned in Step 230 (more particularly, the latest candidate value that is just obtained from Step 230 in the leftmost loop mentioned above), where the proximity sensor threshold TH can be referred to as "threshold TH" in the example shown in FIG. 2, for brevity. For example, the MCU 120 may push (or write) this candidate value into the buffer for storing the proximity sensor threshold TH within the RAM 122.

Please note that, in Step 230, the MCU 120 may utilize the aforementioned minimum as the candidate value of the proximity sensor threshold TH. This is for illustrative purposes only, and is not meant to be a limitation of the present invention. In some examples, the MCU 120 may adjust this minimum according to various kinds of configurations of the electronic device and/or various kinds of conditions of the electronic device to generate an adjusted result, and utilize the adjusted result as the candidate value of the proximity sensor threshold TH. For example, when an application APP1 (which can be taken as an example of the application APP mentioned above) is running in the foreground, the MCU 120 may adjust this minimum to be higher, and more particularly, may adjust the minimum with a predetermined increment (or a predetermined percentage) to generate the adjusted result. In another example, when another application APP2 (which can be taken as another example of the application APP mentioned above) is running in the foreground, the MCU 120 may adjust this minimum to be lower, and more particularly, may adjust the minimum with a predetermined decrement (or another predetermined percentage) to generate the adjusted result. Thus, no matter whether how the candidate value of the proximity sensor threshold TH is determined based on the aforementioned settings (e.g. the default settings and/or the user settings), the MCU 120 may calculate the "New Threshold" (more particularly, the candidate value of the proximity sensor threshold TH) in run time.

Figure 3:
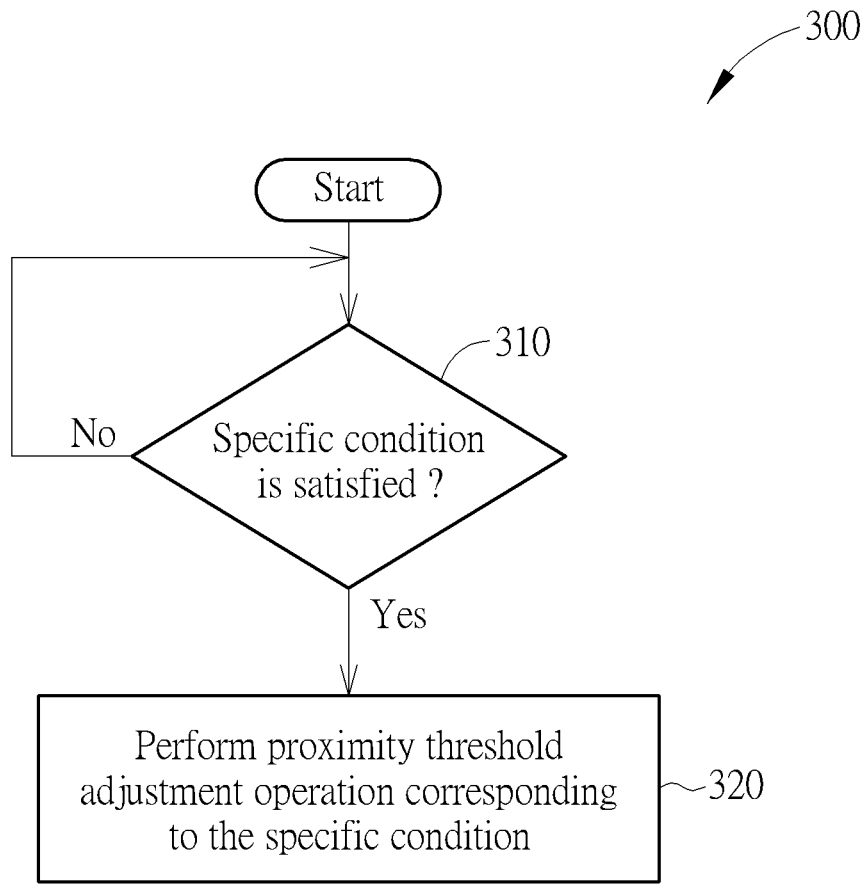
FIG. 3 illustrates a flowchart of a method for controlling an electronic device according to an example.

FIG. 3 illustrates a flowchart of a method 300 for controlling an electronic device such as that mentioned above according to an example, where the method 300 can be applied to the apparatus 100 shown in FIG. 1.

In Step 310, the CPU 110 checks whether a specific condition such as a first condition is satisfied. For example, the CPU 110 checks whether the first condition is satisfied according to an application status, and more particularly, when a specific application is running in the foreground or the specific application is launched, the CPU 110 may determine that the first condition is satisfied. This is for illustrative purposes only, and is not meant to be a limitation of the present invention. In another example, the specific application can be within a predetermined set of applications, and all applications within the predetermined set of applications can be utilized as triggers for causing the first condition to be satisfied, where any application within the predetermined set of applications may cause the first condition to be satisfied. More particularly, when another application within the predetermined set of applications is running in the foreground, the CPU 110 may determine that the first condition is satisfied. No matter whether a single application (e.g. the specific application) or multiple applications (e.g. one or more applications within the predetermined set of applications) may cause the first condition to be satisfied, implementation of the operation of Step 310 will not be hindered. When it is detected that the first condition is satisfied (e.g. the specific application is running in the foreground or is launched), Step 320 is entered; otherwise, Step 310 is re-entered.

In Step 320, under the specific condition (more specifically, when it is detected that the specific condition such as the first condition is satisfied), the CPU 110 controls the MCU 120 to perform a proximity sensor threshold adjustment operation corresponding to the specific condition such as the first condition, where the proximity sensor threshold adjustment operation is utilized for calibrating the P-sensor 50 (e.g. for calibrating the proximity sensor threshold TH of the P-sensor 50). According to this embodiment, the control circuit 105 may perform a proximity sensor threshold adjustment operation corresponding to the first condition when the first condition is satisfied, to obtain an adjusted proximity sensor threshold for the P-sensor 50 (e.g. an adjusted version of the proximity sensor threshold TH). As a result, the control circuit 105 may perform proximity detection by utilizing the P-sensor 50 according to the adjusted proximity sensor threshold. For example, when the specific application is running in the foreground, the CPU 110 may control the MCU 120 to perform the proximity sensor threshold adjustment operation corresponding to the specific application. More particularly, when the specific application is running in the foreground, the CPU 110 may control the MCU 120 to apply a specific offset that is associated to the specific application to the proximity sensor threshold TH (i.e. the aforementioned proximity sensor threshold TH of the P-sensor 50), which can be utilized for determining whether the proximity detection result is NEAR or FAR, where the specific offset may be equal to a positive value or a negative value. This is for illustrative purposes only, and is not meant to be a limitation of the present invention. In some examples, in a situation where the specific application is within the predetermined set of applications and all applications within the predetermined set of applications can be utilized as triggers for causing the first condition to be satisfied, when the other application within the predetermined set of applications is running in the foreground, the CPU 110 may control the MCU 120 to apply another offset that is associated to the other application to the proximity sensor threshold TH, where the other offset may be equal to a positive value or a negative value. In some examples, the other offset mentioned above may be equal to zero, a positive value, or a negative value. In some examples, when the specific application is running in background or is terminated, the CPU 110 may control the MCU 120 to recover the previous value of the proximity sensor threshold TH, i.e. the previous value before the specific offset associated to the specific application is applied to the proximity sensor threshold TH. In some examples, when the specific application is running in background or is terminated, the CPU 110 may control the MCU 120 to recover the initial value of the proximity sensor threshold TH.

According to some embodiments, when at least one status (e.g. one or more statuses) of at least one other sensor (e.g. one or more other sensors) within the electronic device is detected, the control circuit 105 (more particularly, the CPU 110 therein) may determine that the first condition is satisfied. Thus, the MCU 120 may update the candidate value of the proximity sensor threshold TH according to one or more other sensor statuses corresponding to some sensors such as a hall sensor, an accelerometer, touch sensor, etc. within the electronic device, where the aforementioned at least one other sensor may comprise one or a combination of the accelerometer sensor, the touch sensor and the hall sensor. For example, when it is detected that the current accelerometer sensor status matches a predetermined accelerometer sensor status, the control circuit 105 may determine that the first condition is satisfied. In another example, when it is detected that the current touch sensor status matches a predetermined touch sensor status, the control circuit 105 may determine that the first condition is satisfied. In another example, when it is detected that the current hall sensor status matches a predetermined hall sensor status, the control circuit 105 may determine that the first condition is satisfied.

In practice, for example, the MCU 120 may check the current hall sensor status of the hall sensor to decide whether to add an extra offset on the current value of the proximity sensor threshold TH or not. In addition, the MCU 120 may check the current G-sensor status of the G-sensor to get the device angle to decide whether to add an extra offset on the current value of the proximity sensor threshold TH or not. Additionally, the MCU 120 may check the current touch sensor status of the touch sensor to get the touch point numbers to decide whether to add an extra offset on the current value of the proximity sensor threshold TH or not.

As mentioned above, under the first condition (more specifically, when it is detected that the first condition is satisfied), the CPU 110 controls the MCU 120 to perform the proximity sensor threshold adjustment operation corresponding to the first condition, where the proximity sensor threshold adjustment operation is utilized for calibrating the P-sensor 50. This is for illustrative purposes only, and is not meant to be a limitation of the present invention. In some examples, the control circuit 105 may perform the proximity sensor threshold adjustment operation corresponding to the first condition. More particularly, the CPU 110 may directly perform the proximity sensor threshold adjustment operation corresponding to the first condition, where it is unnecessary to control the MCU 120 to perform the proximity sensor threshold adjustment operation corresponding to the first condition in these examples.

As mentioned above, when the specific application is running in the foreground, the CPU 110 may control the MCU 120 to perform the proximity sensor threshold adjustment operation corresponding to the specific application. This is for illustrative purposes only, and is not meant to be a limitation of the present invention. In some examples, the control circuit 105 may perform the proximity sensor threshold adjustment operation corresponding to the specific application. More particularly, the CPU 110 may directly perform the proximity sensor threshold adjustment operation corresponding to the specific application, where it is unnecessary to control the MCU 120 to perform the proximity sensor threshold adjustment operation corresponding to the specific application in these examples.

As mentioned above, when the specific application is running in the foreground, the CPU 110 may control the MCU 120 to apply the specific offset that is associated to the specific application to the proximity sensor threshold TH, which can be utilized for determining whether the proximity detection result is NEAR or FAR. This is for illustrative purposes only, and is not meant to be a limitation of the present invention. In some examples, when the specific application is running in the foreground, the control circuit 105 may apply the specific offset that is associated to the specific application to the proximity sensor threshold TH, which can be utilized for determining whether the proximity detection result is NEAR or FAR. More particularly, the CPU 110 may directly apply the specific offset that is associated to the specific application to the proximity sensor threshold TH, which can be utilized for determining whether the proximity detection result is NEAR or FAR.

As mentioned above, in a situation where the specific application is within the predetermined set of applications and all applications within the predetermined set of applications can be utilized as triggers for causing the first condition to be satisfied, when the other application within the predetermined set of applications is running in the foreground, the CPU 110 may control the MCU 120 to apply the other offset that is associated to the other application to the proximity sensor threshold TH. This is for illustrative purposes only, and is not meant to be a limitation of the present invention. In some examples, in a situation where the specific application is within the predetermined set of applications and all applications within the predetermined set of applications can be utilized as triggers for causing the first condition to be satisfied, when the other application within the predetermined set of applications is running in the foreground, the control circuit 105 may apply the other offset that is associated to the other application to the proximity sensor threshold TH. More particularly, in a situation where the specific application is within the predetermined set of applications and all applications within the predetermined set of applications can be utilized as triggers for causing the first condition to be satisfied, when the other application within the predetermined set of applications is running in the foreground, the CPU 110 may directly apply the other offset that is associated to the other application to the proximity sensor threshold TH.

In practice, no matter whether the CPU 110 or the MCU 120 performs the perform the proximity sensor threshold adjustment operation corresponding to the first condition, the proximity sensor threshold TH can be directly changed (or adjusted) during the proximity sensor threshold adjustment operation mentioned in Step 320. For example, the CPU 110 or the MCU 120 may apply a predetermined offset (e.g. the specific offset that is associated to the specific application, or the other offset that is associated to the other application) to the proximity sensor threshold TH by updating the proximity sensor threshold TH with the summation of the previous value of the proximity sensor threshold TH and this predetermined offset. This is for illustrative purposes only, and is not meant to be a limitation of the present invention. In some examples, the control circuit 105 (more particularly, the CPU 110 or the MCU 120) determines the proximity detection result of the P-sensor 50 to be NEAR or FAR according to a derivative of the proximity sensor threshold TH, such as a condition-related proximity sensor threshold TH_c (e.g. the condition-related proximity sensor threshold may be associated to the first condition mentioned in Step 310) in Step 240 of these examples. For example, the condition-related proximity sensor threshold TH_c can be equal to the summation of the proximity sensor threshold TH and this predetermined offset (e.g. the specific offset that is associated to the specific application, or the other offset that is associated to the other application), where adjusting the condition-related proximity sensor threshold TH_c by changing this predetermined offset will not change the proximity sensor threshold TH, and the proximity sensor threshold TH can still be dynamically calibrated by at least one other step within the method 200 of the example shown in FIG. 2 (more particularly, the steps within the method 200 except for Step 240). Thus, the control circuit 105 (more particularly, the CPU 110 or the MCU 120) may adjust the condition-related proximity sensor threshold TH_c without changing the proximity sensor threshold TH during the proximity sensor threshold adjustment operation corresponding to the first condition (e.g. the proximity sensor threshold adjustment operation mentioned in Step 320 of these examples).

Figure 4:
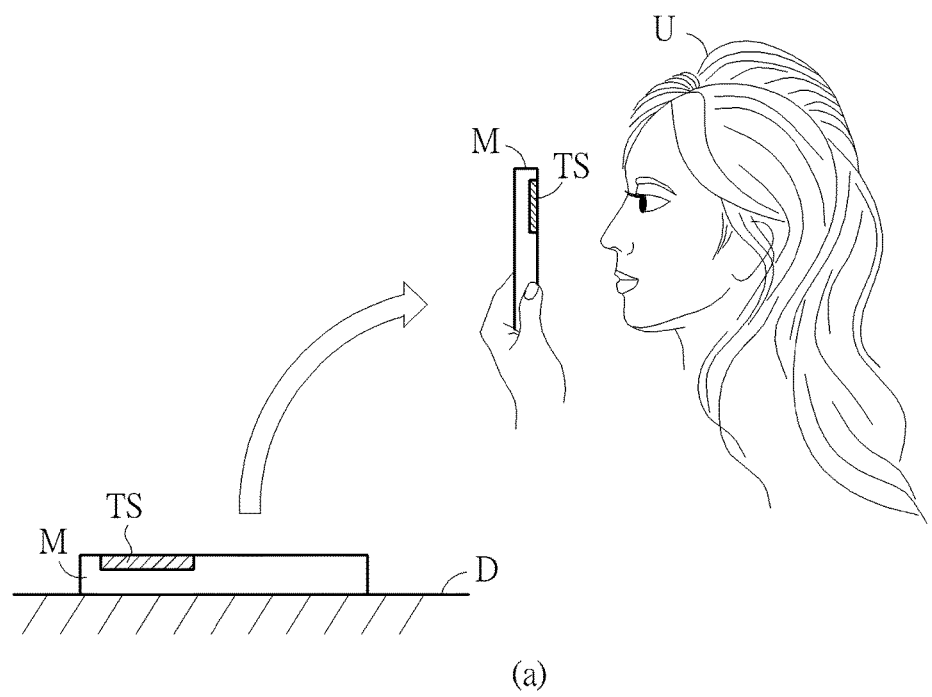
FIG. 4 is a schematic diagram illustrating an example regarding how a method for controlling an electronic device works.
Figure 4:
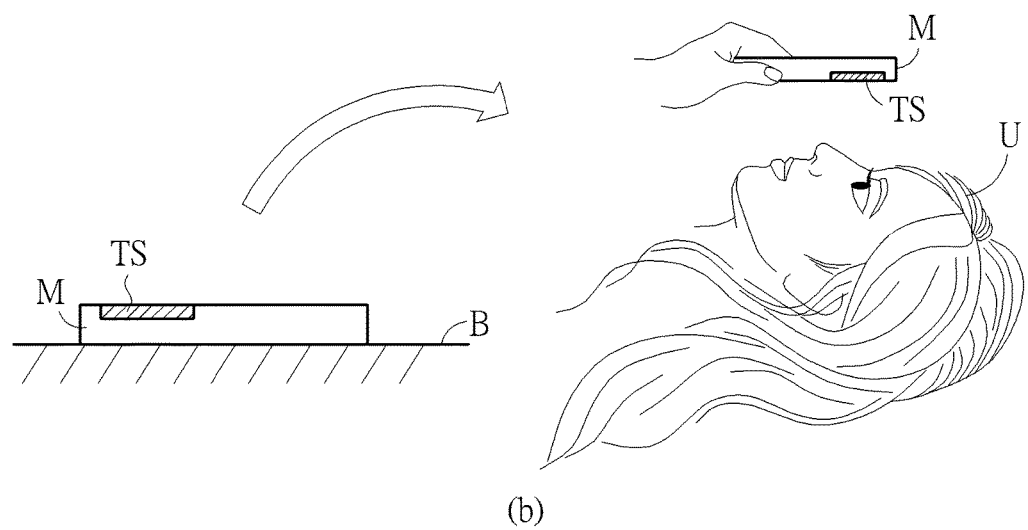

FIG. 4 is a schematic diagram illustrating an example regarding how a method for controlling an electronic device such as that mentioned above (e.g. the electronic device mentioned in the example shown in FIG. 3) works, where this method can be applied to the apparatus 100 shown in FIG. 1. Please note that the mobile phone M can be taken as an example of the mobile phone mentioned above.

As shown in sub-diagram (a) of FIG. 4, in a situation where the mobile phone M equipped with a touch screen TS originally lays on a desk D and operates in a sleep mode such as that mentioned above, a user U, who is standing or sitting in this situation, takes the mobile phone M from the desk D, and a tilt angle of the mobile phone M is sensed by the apparatus 100. As shown in sub-diagram (b) of FIG. 4, in a situation where the mobile phone M originally lays on a bed B and operates in a sleep mode such as that mentioned above, the user U, who is laying down on the bed B in this situation, takes the mobile phone M from the bed D, and a tilt angle of the mobile phone M is also sensed by the apparatus 100. Please note that, in the sleep mode, the display within the touch screen TS (e.g. a liquid crystal display (LCD) module therein, where the LCD module can be referred to as the LCM, for brevity) is off and nothing is displayed on the display within the touch screen TS.

For example, the touch sensing device within the touch screen TS may be inactive (or non-active) in the sleep mode. In another example, the touch sensing device may be active in the sleep mode but the data sensed by the touch sensing device may be ignored. No matter which circumstance does the touch sensing device operates in (more particularly, no matter whether the touch screen TS is active or inactive), the mobile phone M does not respond to the touch control operation applied to the touch sensing device (e.g. touch inputs such as touch gesture inputs of the user U) in the sleep mode. After a tilt angle such as any of the tilt angles mentioned above is sensed, this tile angle is determined if it falls within a predetermined angle range. If yes (e.g. it is determined that this tile angle falls within the predetermined angle range), a user input from an input device of the mobile phone M (e.g. the touch sensing device, or a physical button of the mobile phone M) is sensed, in a situation where the display is off or nothing is displayed on the display. As a result, under control of the control circuit 105, a predetermined function can be performed based on the user input, with the display is on or the display is off. Examples of the predetermined function may include, but not limited to, an operation of playing a video clip, an operation of playing audio file, an operation of launching a phone call control interface, and an operation of running a predetermined application (e.g. the specific application mentioned above, or the other application within the predetermined set of applications mentioned above).

Figure 5:
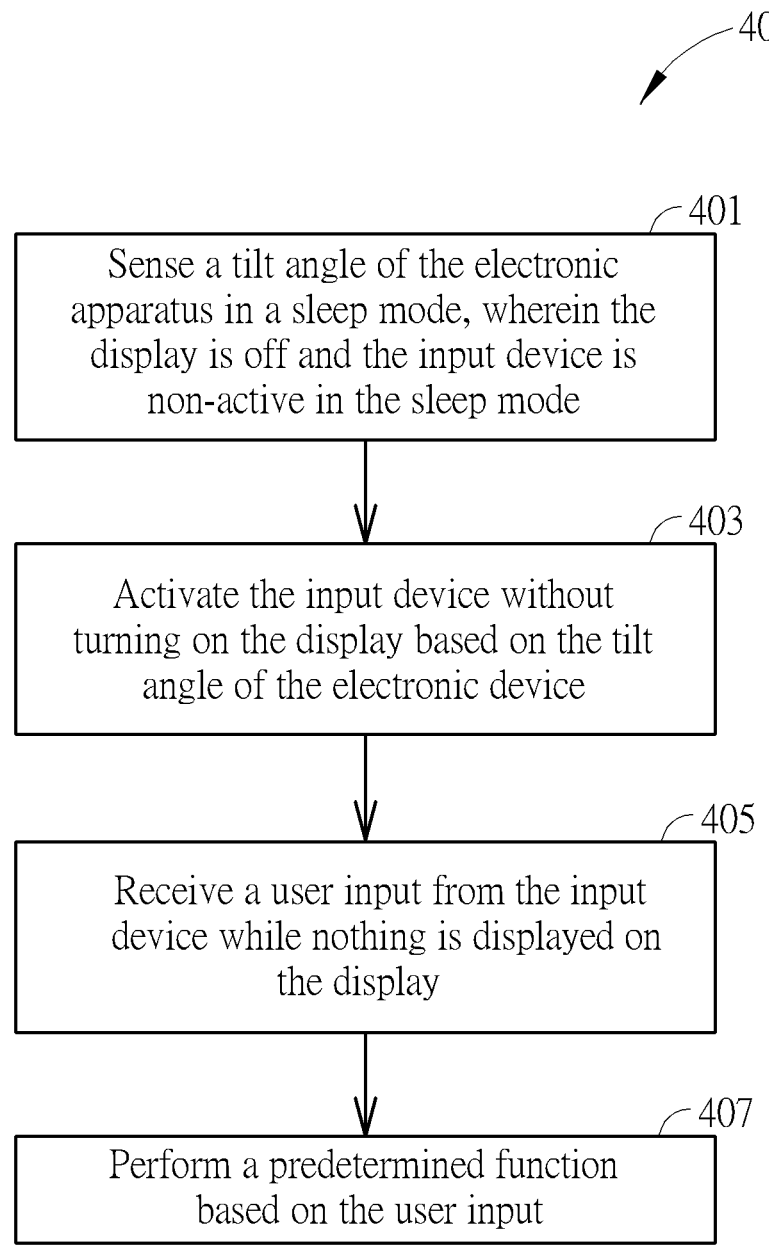
FIG. 5 illustrates a flowchart of the method of the example shown in FIG. 4.

The above-mentioned operation can be illustrated as the steps shown in FIG. 5, which illustrates a flowchart of the method of the example shown in FIG. 4, such as the method 400 for controlling the electronic device mentioned above, where the method 400 shown in FIG. 5 can be applied to the apparatus 100 shown in FIG. 1. The method 400 can be described as follows.

In Step 401, the MCU 120 utilize the motion sensor 70 to sense a tilt angle of the electronic device in a sleep mode such as that mentioned above, where the display is off and the input device is non-active in the sleep mode.

In Step 403, the MCU 120 activates the input device without turning on the display based on the tilt angle of the electronic device.

In Step 405, the control circuit 105 (e.g. the CPU 110, or the MCU 120) receives a user input from the input device while nothing is displayed on the display. For example, the display may be off, or the display may be active but nothing is displayed on the display.

In Step 407, the control circuit 105 (e.g. the CPU 110, or the MCU 120) performs a predetermined function based on the user input.

Figure 6:
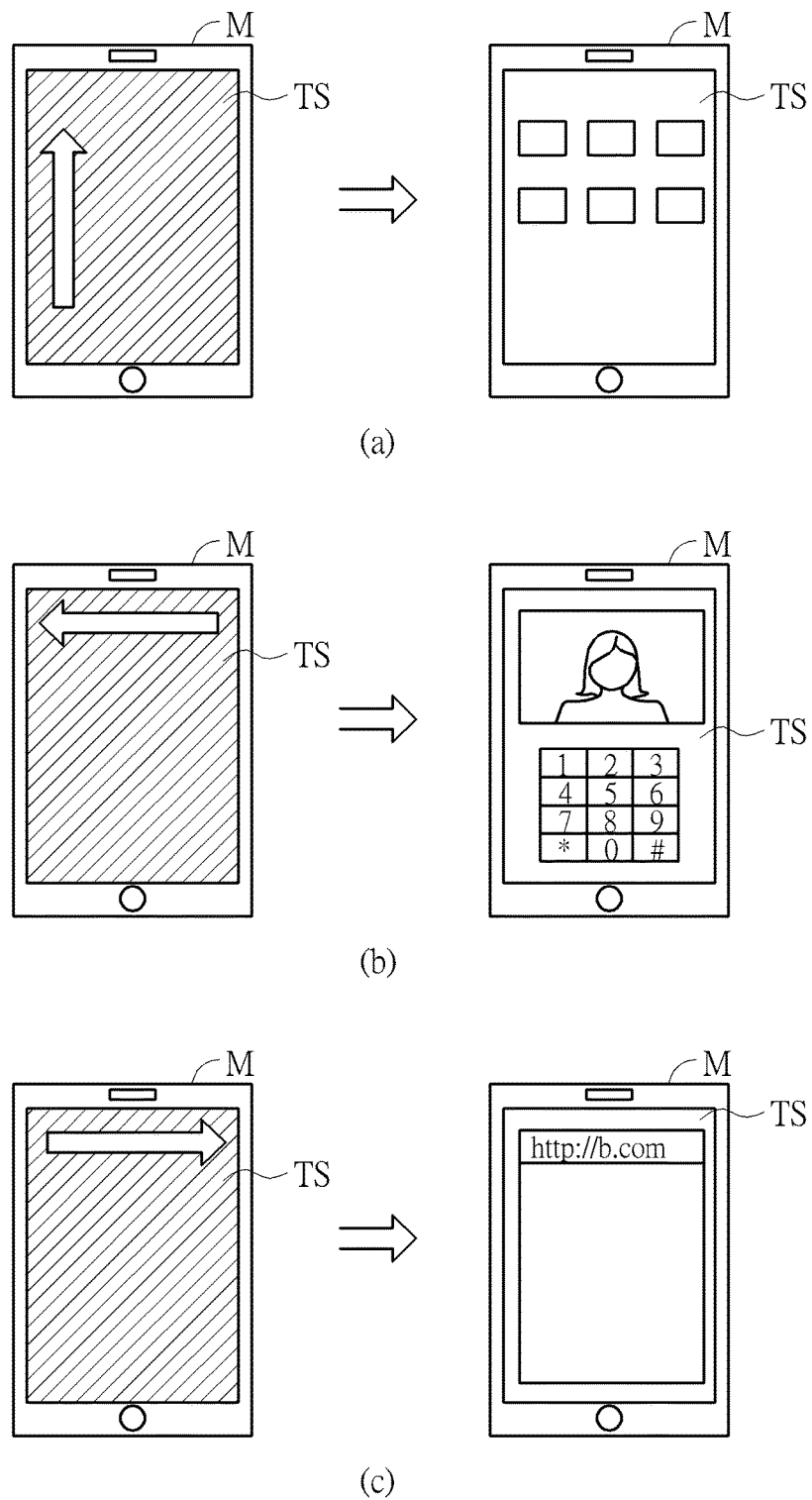
FIG. 6 is a schematic diagram illustrating that the user input is a gesture according to an example.

For example, the input device can be a touch sensing device, and the user input can be a gesture. If the user input meets a predetermined gesture, the mobile phone M performs a predetermined function such as that mentioned above. FIG. 6 is a schematic diagram illustrating the case that the user input is a gesture. Please note that the display is still off while the apparatus 100 (or the electronic device) is receiving the user input. As shown in sub-diagram (a) of FIG. 6, in a situation where the user slides from down to up on the touch screen TS, the display is turned on, and the mobile phone M backs to a home scene, where the predetermined function corresponding to the user input shown in sub-diagram (a) of FIG. 6 may comprise the operation of turning on the display and may further comprise the operation of controlling the mobile phone M to back to the home scene. In addition, as shown in sub-diagram (b) of FIG. 6, in a situation where the user slides from right to left on the touch screen TS, the display is turned on, and the mobile phone M launches a dialer application, where the predetermined function corresponding to the user input shown in sub-diagram (b) of FIG. 6 may comprise the operation of turning on the display and may further comprise the operation of launching the dialer application. Additionally, as shown in sub-diagram (c) of FIG. 6, in a situation where the user slides from left to right on the touch screen TS, the display is turned on, and the mobile phone M launches a web browser application, where the predetermined function corresponding to the user input shown in sub-diagram (c) of FIG. 6 may comprise the operation of turning on the display and may further comprise the operation of launching the web browser application. This is for illustrative purposes only, and is not meant to be a limitation of the present invention. In another example that is not illustrated in FIG. 6, in a situation where the user continuously taps the touch screen TS for two times, only the display is turned on and no other operation is performed, where the predetermined function corresponding to the user input of this example may comprise the operation of turning on the display.

In some examples that are not illustrated in FIG. 6, in a situation where the user input is detected, the display is turned on and nothing is displayed on the display, where the predetermined function corresponding to the user input of these example may comprise the operation of turning on the display while nothing is displayed on the display, and may further comprise at least one other operation (e.g. one or more other operations). Examples of the aforementioned at least one other operation may include, but not limited to, an operation of playing music, an operation of performing audio recording, and an operation of performing video recording. Thus, the predetermined function may comprise the aforementioned at least one other operation (e.g. the operation of playing music, the operation of performing audio recording, and/or the operation of performing video recording) while nothing is displayed on the display.

In the example shown in FIG. 6, the predetermined function corresponding to the user input shown in any sub-diagram within sub-diagrams (a), (b), and (c) of FIG. 6 may comprise the operation of turning on the display. This is for illustrative purposes only, and is not meant to be a limitation of the present invention. Please note that, in some examples, the predetermined function is not limited to comprising the operation of turning on the display. For example, the predetermined function may comprise the operation of playing music while the display is off. In another example, the predetermined function may comprise the operation of performing audio recording while the display is off. In another example, the predetermined function may comprise the operation of performing video recording while the display is off.

In the example shown in FIG. 6, the input device can be a touch sensing device, and the user input can be a gesture. This is for illustrative purposes only, and is not meant to be a limitation of the present invention. In another example, the input device can be a hardware button provided on the mobile phone M, such as a hardware button for controlling the volume of an audio output of the mobile phone M.

Figure 7:
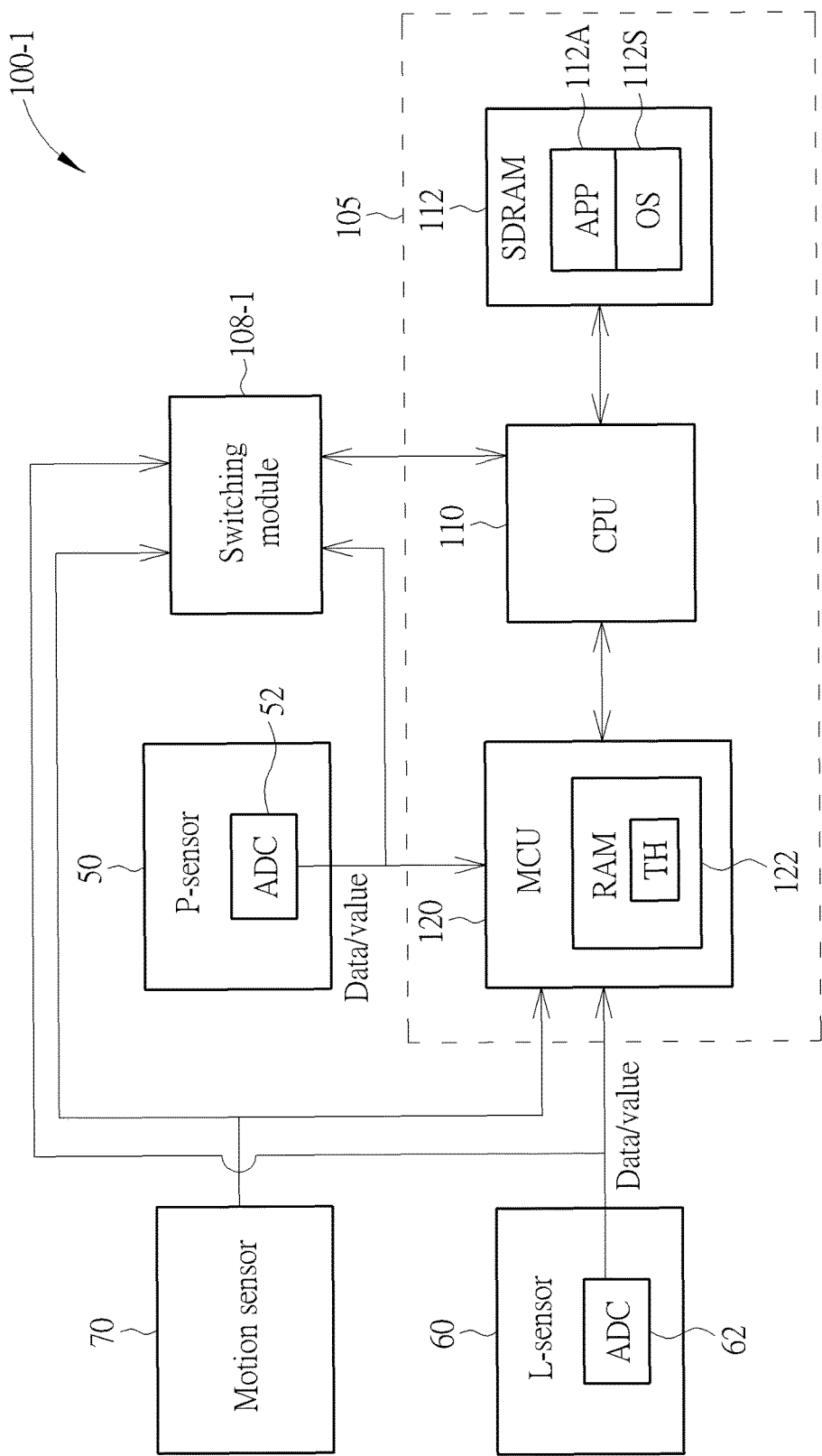
FIG. 7 is a diagram of an apparatus for controlling an electronic device according to another example.

FIG. 7 is a diagram of an apparatus 100-1 for controlling an electronic device according to another example. In this example, the apparatus 100-1 may comprise the components shown in FIG. 1, and may utilize these components to perform the associated operations corresponding to these components, respectively. As shown in FIG. 7, the apparatus 100-1 may further comprise a switching module 108-1, where the switching module 108-1 is arranged for selectively switching the output path of the P-sensor 50, selectively switching the output path of the L-sensor 60, and selectively switching at least one output path (e.g. one or more output paths) of the motion sensor 70, respectively. More particularly, under control of the control circuit 105 (e.g. the CPU 110 and/or the MCU 120), the P-sensor 50 may selectively send one or more outputs thereof toward the CPU 110 through the switching module 108-1, the L-sensor 60 may selectively send one or more outputs thereof toward the CPU 110 through the switching module 108-1, and the motion sensor 70 may selectively send one or more outputs thereof toward the CPU 110 through the switching module 108-1. For example, in the aforementioned active mode (e.g. the non-sleep mode mentioned above) of the electronic device, the CPU 110 may be active, and is capable of receiving the aforementioned one or more outputs of the P-sensor 50 through the switching module 108-1, receiving the aforementioned one or more outputs of the L-sensor 60 through the switching module 108-1, and receiving the aforementioned one or more outputs of the motion sensor 70 through the switching module 108-1. For brevity, similar descriptions for this example are not repeated in detail here.

Please note that at least one method (e.g. one or more methods) within the examples respectively shown in FIG. 2, FIG. 3, FIG. 4, FIG. 5, and FIG. 6 can be applied to the apparatus 100-1 shown in FIG. 7. For example, the method 200 shown in FIG. 2 can be applied to the apparatus 100-1 shown in FIG. 7. In another example, the method 300 shown in FIG. 3 can be applied to the apparatus 100-1 shown in FIG. 7. In another example, the method 400 shown in FIG. 5 can be applied to the apparatus 100-1 shown in FIG. 7. For brevity, similar descriptions for the example shown in FIG. 7 (e.g. implementation details regarding applying the aforementioned at least one method to the apparatus 100-1 shown in FIG. 7) are not repeated in detail here.

Figure 8:
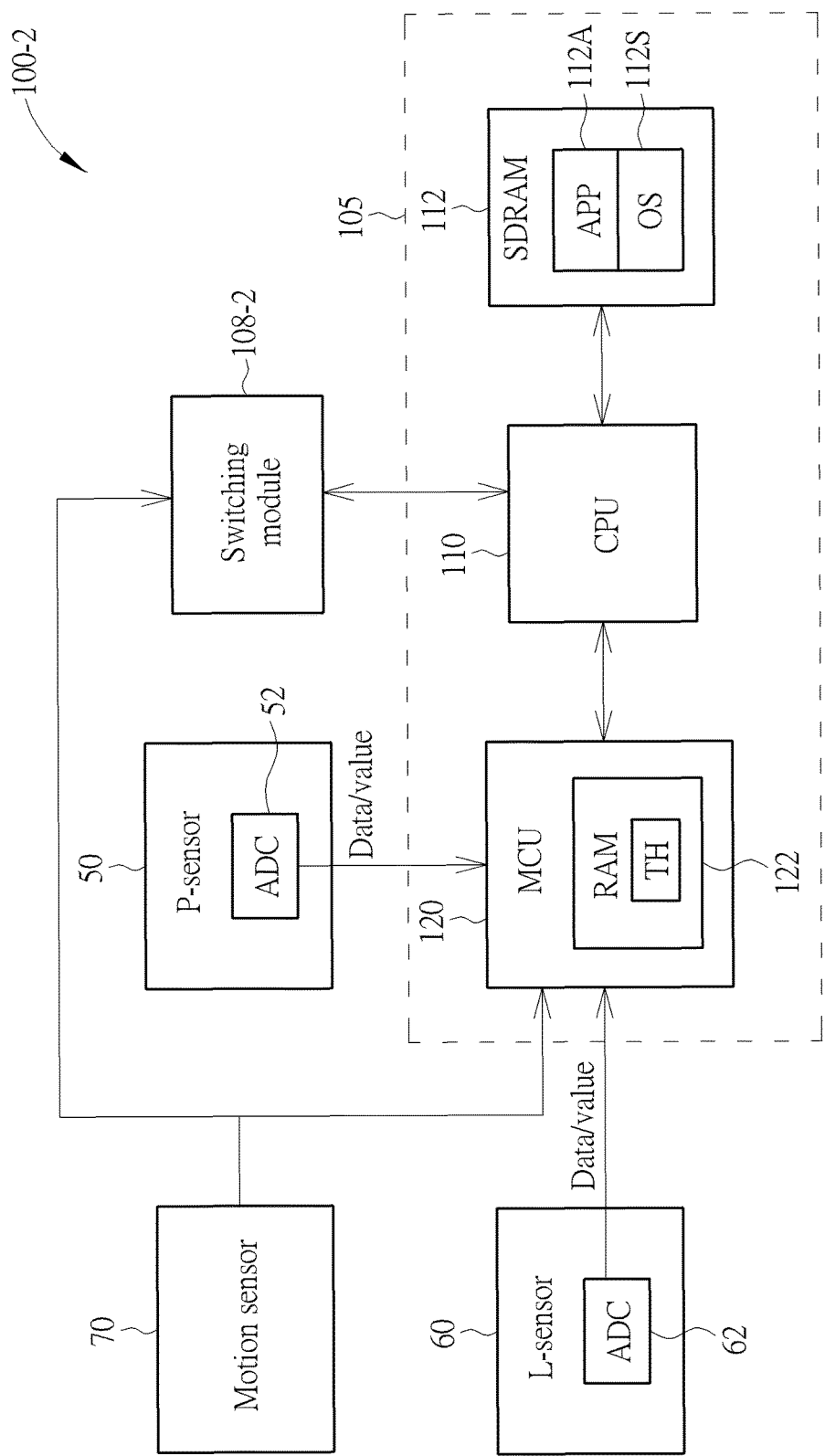
FIG. 8 is a diagram of an apparatus for controlling an electronic device according to another example.

FIG. 8 is a diagram of an apparatus 100-2 for controlling an electronic device according to another example. In this example, the apparatus 100-2 may comprise the components shown in FIG. 1, and may utilize these components to perform the associated operations corresponding to these components, respectively. As shown in FIG. 8, the apparatus 100-2 may further comprise a switching module 108-2, where the switching module 108-2 is arranged for selectively switching at least one output path (e.g. one or more output paths) of the motion sensor 70. More particularly, under control of the control circuit 105 (e.g. the CPU 110 and/or the MCU 120), the motion sensor 70 may selectively send one or more outputs thereof toward the CPU 110 through the switching module 108-2. For example, in the aforementioned active mode (e.g. the non-sleep mode mentioned above) of the electronic device, the CPU 110 may be active, and is capable of receiving the aforementioned one or more outputs of the motion sensor 70 through the switching module 108-2. For brevity, similar descriptions for this example are not repeated in detail here.

Please note that at least one method (e.g. one or more methods) within the examples respectively shown in FIG. 2, FIG. 3, FIG. 4, FIG. 5, and FIG. 6 can be applied to the apparatus 100-2 shown in FIG. 8. For example, the method 200 shown in FIG. 2 can be applied to the apparatus 100-2 shown in FIG. 8. In another example, the method 300 shown in FIG. 3 can be applied to the apparatus 100-2 shown in FIG. 8. In another example, the method 400 shown in FIG. 5 can be applied to the apparatus 100-2 shown in FIG. 8. For brevity, similar descriptions for the example shown in FIG. 8 (e.g. implementation details regarding applying the aforementioned at least one method to the apparatus 100-2 shown in FIG. 8) are not repeated in detail here.

Please note that a mobile phone can be taken as an example for explaining, but it does not mean the present invention is limited to be applied to a mobile phone, where the control method provided in any of the examples described above can be applied to any of other types of electronic devices. In addition, a touch screen (e.g. the touch screen TS shown in FIG. 4), which can be regarded as an apparatus comprising a touch sensing device and a display that are integrated together, can be applied as an example. Therefore, in some of the above descriptions, if a display is mentioned, it mentions the display within the touch screen. If a touch sensing device is mentioned, it mentions the touch sensing device within the touch screen. However, please note the electronic device of some other examples may comprise a display and a touch sensing device that are independent from each other.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for controlling an electronic device, which comprises a proximity sensor for performing proximity detection, the method comprising the steps of:
   when a specific application is launched or is running in the foreground of the electronic device, determining that a first condition is satisfied according to an application status;
   when the first condition is satisfied, performing a proximity sensor threshold adjustment operation corresponding to the specific application to obtain an adjusted proximity sensor threshold for the proximity sensor, wherein when the specific application is a first specific application, the proximity sensor threshold adjustment operation obtains a first adjusted proximity sensor threshold, and when the specific application is a second specific application, the proximity sensor threshold adjustment operation obtains a second adjusted proximity sensor threshold, wherein the first adjusted proximity sensor threshold is different from the second adjusted proximity sensor threshold;
   performing proximity detection by utilizing the proximity sensor according to the adjusted proximity sensor threshold; and when an object is determined to be near the electronic device according to the adjusted proximity sensor threshold, performing a predetermined function of the specific application.

2. The method of claim 1, wherein the specific application is within a predetermined set of applications, and all applications within the predetermined set of applications are utilized as triggers for causing the first condition to be satisfied.

3. The method of claim 2, wherein the step of determining whether the first condition is satisfied according to the application status further comprises:
when another application within the predetermined set of applications is running in the foreground, determining that the first condition is satisfied.

4. The method of claim 1, wherein the step of performing the proximity sensor threshold adjustment operation corresponding to the specific application further comprises:
when the specific application is running in the foreground, applying a specific offset that is associated with the specific application to a proximity sensor threshold of the proximity sensor to obtain the adjusted proximity sensor threshold.

5. The method of claim 4, wherein the specific offset is equal to a positive value or a negative value.

6. The method of claim 4, wherein the specific application is within a predetermined set of applications, and all applications within the predetermined set of applications are utilized as triggers for causing the first condition to be satisfied; and the step of performing the proximity sensor threshold adjustment operation corresponding to the first condition further comprises:
when another application within the predetermined set of applications is running in the foreground, applying another offset that is associated with the other application to the proximity sensor threshold of the proximity sensor to obtain the adjusted proximity sensor threshold.

7. The method of claim 6, wherein the other offset is equal to a positive value or a negative value.

8. The method of claim 1, wherein the step of determining whether the first condition is satisfied according to the application status further comprises:
when at least one status of at least one other sensor within the electronic device is detected, determining that the first condition is satisfied, wherein the at least one other sensor comprises one or a combination of an accelerometer sensor, a touch sensor and a hall sensor.

9. An apparatus for controlling an electronic device, the apparatus comprising at least one portion of the electronic device, the apparatus comprising:
a proximity sensor arranged for performing proximity detection; and
a control circuit, coupled to the proximity sensor, and comprising a processor arranged for running program codes to control operations of the electronic device, wherein the processor determines that a first condition is satisfied according to an application status when a specific application is launched or is running in the foreground of the electronic device, and the control circuit performs a proximity sensor threshold adjustment operation corresponding to the specific application when the first condition is satisfied, to obtain an adjusted proximity sensor threshold for the proximity sensor, wherein when the specific application is a first specific application, the proximity sensor threshold adjustment operation obtains a first adjusted proximity sensor threshold, and when the specific application is a second specific application, the proximity sensor threshold adjustment operation obtains a second adjusted proximity sensor threshold, the first adjusted proximity sensor threshold being different from the second adjusted proximity sensor threshold, performs proximity detection by utilizing the proximity sensor according to the adjusted proximity sensor threshold, and when an object is determined to be near the electronic device according to the adjusted proximity sensor threshold, performs a predetermined function of the specific application.

10. The apparatus of claim 9, wherein the specific application is within a predetermined set of applications, and all applications within the predetermined set of applications are utilized as triggers for causing the first condition to be satisfied.

11. The apparatus of claim 10, wherein when another application within the predetermined set of applications is running in the foreground, the processor determines that the first condition is satisfied.

12. The apparatus of claim 9, wherein when the specific application is running in the foreground, the control circuit applies a specific offset that is associated with the specific application to a proximity sensor threshold of the proximity sensor to obtain the adjusted proximity sensor threshold.

13. The apparatus of claim 12, wherein the specific offset is equal to a positive value or a negative value.

14. The apparatus of claim 12, wherein the specific application is within a predetermined set of applications, and all applications within the predetermined set of applications are utilized as triggers for causing the first condition to be satisfied; and when another application within the predetermined set of applications is running in the foreground, the control circuit applies another offset that is associated with the other application to the proximity sensor threshold of the proximity sensor to obtain the adjusted proximity sensor threshold.

15. The apparatus of claim 14, wherein the other offset is equal to a positive value or a negative value.

16. The apparatus of claim 9, wherein when at least one status of at least one other sensor within the electronic device is detected, the control circuit determines that the first condition is satisfied, wherein the at least one other sensor comprises one or a combination of an accelerometer sensor, a touch sensor and a hall sensor.

* * * * *